United States Patent
Tomasel et al.

(10) Patent No.: US 7,942,112 B2
(45) Date of Patent: May 17, 2011

(54) METHOD AND APPARATUS FOR PREVENTING THE FORMATION OF A PLASMA-INHIBITING SUBSTANCE

(75) Inventors: Fernando Gustavo Tomasel, Fort Collins, CO (US); Justin Mauck, Fort Collins, CO (US); Andrew Shabalin, Fort Collins, CO (US); Denis Shaw, Fort Collins, CO (US); Juan Jose Gonzalez, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 512 days.

(21) Appl. No.: 11/566,610

(22) Filed: Dec. 4, 2006

(65) Prior Publication Data
US 2008/0127893 A1 Jun. 5, 2008

(51) Int. Cl.
C23C 16/00 (2006.01)
C23F 1/00 (2006.01)
H01L 21/306 (2006.01)
H05B 31/26 (2006.01)

(52) U.S. Cl. ............. 118/723 I; 118/723 IR; 118/723 E; 118/723 ER; 156/345.35; 156/345.43; 156/345.44; 156/345.45; 156/345.46; 156/345.47; 156/345.48; 315/111.21; 315/111.41; 315/111.51; 315/111.71

(58) Field of Classification Search ............... 118/723 E, 118/723 ER, 723 I, 723 IR; 156/345.35, 156/345.48; 315/111.71
See application file for complete search history.

(56) References Cited

U.S. PATENT DOCUMENTS

| | | | |
|---|---|---|---|
| 5,891,350 A * | 4/1999 | Shan et al. | 216/71 |
| 6,156,667 A | 12/2000 | Jewett | |
| 6,189,484 B1 * | 2/2001 | Yin et al. | 118/723 I |
| 6,291,938 B1 | 9/2001 | Jewett | |
| 6,335,535 B1 | 1/2002 | Miyake et al. | |
| 6,394,026 B1 * | 5/2002 | Wicker et al. | 156/345.1 |
| 6,592,707 B2 * | 7/2003 | Shih et al. | 156/345.1 |
| 6,692,649 B2 * | 2/2004 | Collison et al. | 216/67 |
| 6,946,063 B1 | 9/2005 | Gonzalez et al. | |
| 2001/0035132 A1 * | 11/2001 | Kent et al. | 118/733 |
| 2002/0104751 A1 * | 8/2002 | Drewery et al. | 204/192.1 |
| 2005/0045107 A1 | 3/2005 | Koroyasu et al. | |
| 2006/0191484 A1 * | 8/2006 | Mitrovic et al. | 118/729 |
| 2008/0132078 A1 * | 6/2008 | Yamazaki | 438/710 |

FOREIGN PATENT DOCUMENTS
JP 2000-133497 * 5/2000
JP 2006-073722 * 3/2006
WO WO 2006/044791 A2 4/2006

* cited by examiner

*Primary Examiner* — Parviz Hassanzadeh
*Assistant Examiner* — Rakesh Dhingra
(74) *Attorney, Agent, or Firm* — Neugeboren O'Dowd PC; Sean R. O'Dowd

(57) ABSTRACT

A system and method for preventing formation of a plasma-inhibiting substance within a plasma chamber is provided. In one embodiment, an apparatus that includes a barrier component configured to be disposed within a plasma chamber. The barrier component includes a wall that defines a plasma formation region where a chemically-reducing species is formed from a fluid. A portion of the wall is formed of a substance that is substantially inert to the chemically-reducing species. The wall prevents the chemically-reducing species from interacting with an inner surface of the plasma chamber to form a conductive substance. The barrier component also includes an opening in fluid communication with the plasma formation region. The fluid is introduced into the plasma formation region via the opening.

7 Claims, 9 Drawing Sheets

US 7,942,112 B2

METHOD AND APPARATUS FOR PREVENTING THE FORMATION OF A PLASMA-INHIBITING SUBSTANCE

FIELD OF THE INVENTION

The present invention relates to plasma formation within a plasma chamber. In particular, but not by way of limitation, the present invention relates to systems and methods for preventing formation of a plasma-inhibiting substance within a plasma chamber.

BACKGROUND OF THE INVENTION

The production of a chemically-reducing species is key in many applications such as, for example, the removal of oxides from the surface of substrates and the deposition of thin films. These chemically-reducing species can be generated by dissociating molecular gases with plasma sources such as remote and/or inductive plasma sources.

The chemically-reducing species generated by the plasma source, however, can partially convert the wall material of the plasma source, which is usually an oxide-based material (e.g., ceramic oxide) into a material that can degrade the plasma source's performance (e.g., inconsistent plasma species output). The conversion of the wall material via chemical reduction of the oxide into, for example, a continuous, conductive coating on the inner wall of the chamber of the plasma source can result in degradation of the power coupling to the plasma and the ignition characteristics of the plasma source. Removing the performance degrading material to eliminate these drawbacks can be time-consuming and costly. These problems are particularly acute for medium to high power plasma sources where the output flux of the chemically-reducing species is significant.

Although present plasma sources are functional, they are not sufficiently durable or otherwise satisfactory. Accordingly, a system and method are needed to address the shortfalls of present technology and to provide other new and innovative features for preventing formation of a material that can degrade the performance of a plasma source.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

The present invention can provide a system and method for preventing formation of a plasma-inhibiting substance within a plasma chamber. In one exemplary embodiment, the present invention is an apparatus that includes a barrier component configured to be disposed within a plasma chamber. The barrier component includes a wall that defines a plasma formation region where a plasma is ignited from a fluid resulting in the production of a chemically-reducing species. A portion of the wall is formed of a substance that is substantially inert to the chemically-reducing species. The wall prevents the chemically-reducing species from interacting with an inner surface of the plasma chamber to form a conductive substance. The barrier component also includes an opening in fluid communication with the plasma formation region. The fluid is introduced into the plasma formation region via the opening.

In another embodiment of the invention, an apparatus includes a plasma chamber defining a plasma formation region where a plasma is ignited to produce a chemically-reducing species. A portion of the plasma chamber is formed of a barrier-layer material that is substantially resistant to being reduced by the reducing species to form a conductive material. The apparatus also includes an RF power induction component coupled to the plasma chamber. The RF power induction component is configured to receive RF power from an RF power source. The plasma formation region corresponds to a volume where an electromagnetic field is generated by the RF power induction component.

In yet another embodiment of the invention, a method includes providing a plasma chamber configured to ignite plasmas in a fluid. The plasma is ignited within a plasma formation region and produces a chemically-reducing species. The method also includes preventing, using a barrier layer, a plasma-ignition inhibiting material from forming in response to an interaction of the chemically-reducing species with a portion of the plasma chamber. The barrier layer is formed of a substance that is substantially inert to the chemically-reducing species.

As previously stated, the above-described embodiments and implementations are for illustration purposes only. Numerous other embodiments, implementations, and details of the invention are easily recognized by those of skill in the art from the following descriptions and claims.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawings wherein:

DETAILED DESCRIPTION

Embodiments of the invention are related to systems and methods for preventing formation of a plasma-inhibiting substance within a plasma chamber that is configured to produce one or more chemically-reducing species (e.g., a species that is a reducing agent). A plasma-inhibiting substance (also referred to as a plasma-ignition-inhibiting substance) substantially reduces the ability of the plasma chamber to form and/or sustain a plasma within the plasma chamber. In particular, several embodiments of the present invention prevent the chemically reducing species formed within the plasma chamber from interacting (e.g., reacting) with an inner surface of the plasma chamber, and as a consequence, these embodiments help to prevent the formation of conductive substances that have been found to substantially decrease the performance of the plasma chamber. In some embodiments, the present invention is implemented in a remote plasma chamber configured to produce a plasma species and deliver the plasma species to a different vessel (e.g., reaction vessel) rather than use the plasma species in an in situ reaction.

In accordance with several embodiments, one or more chemically-reducing species are prevented from interacting with an inner surface of the plasma chamber wall by a barrier layer that is substantially inert with respect to the chemically-reducing species. In some embodiments, the barrier layer can be coated on the inner surface of the plasma chamber. The barrier layer, in other embodiments, is a barrier component (e.g., sleeve) that is inserted into the plasma chamber. Some variations of the barrier component are removably coupled within the plasma chamber. In some implementations of the invention, the plasma chamber or substantial portions of the plasma chamber are constructed of a material that prevents formation of a plasma-inhibiting substance. And in some embodiments, a plasma chamber or component inserted into the plasma chamber is cleaned after a plasma-inhibiting substance has formed.

Although each of the figures highlight certain aspects of the invention, a person of ordinary skill in the art should appreciate, having the benefit of this disclosure that the various aspects of the invention (e.g., plasma chambers, barrier components, flanges, etc.) can be combined in a variety of combinations.

Figure 1:
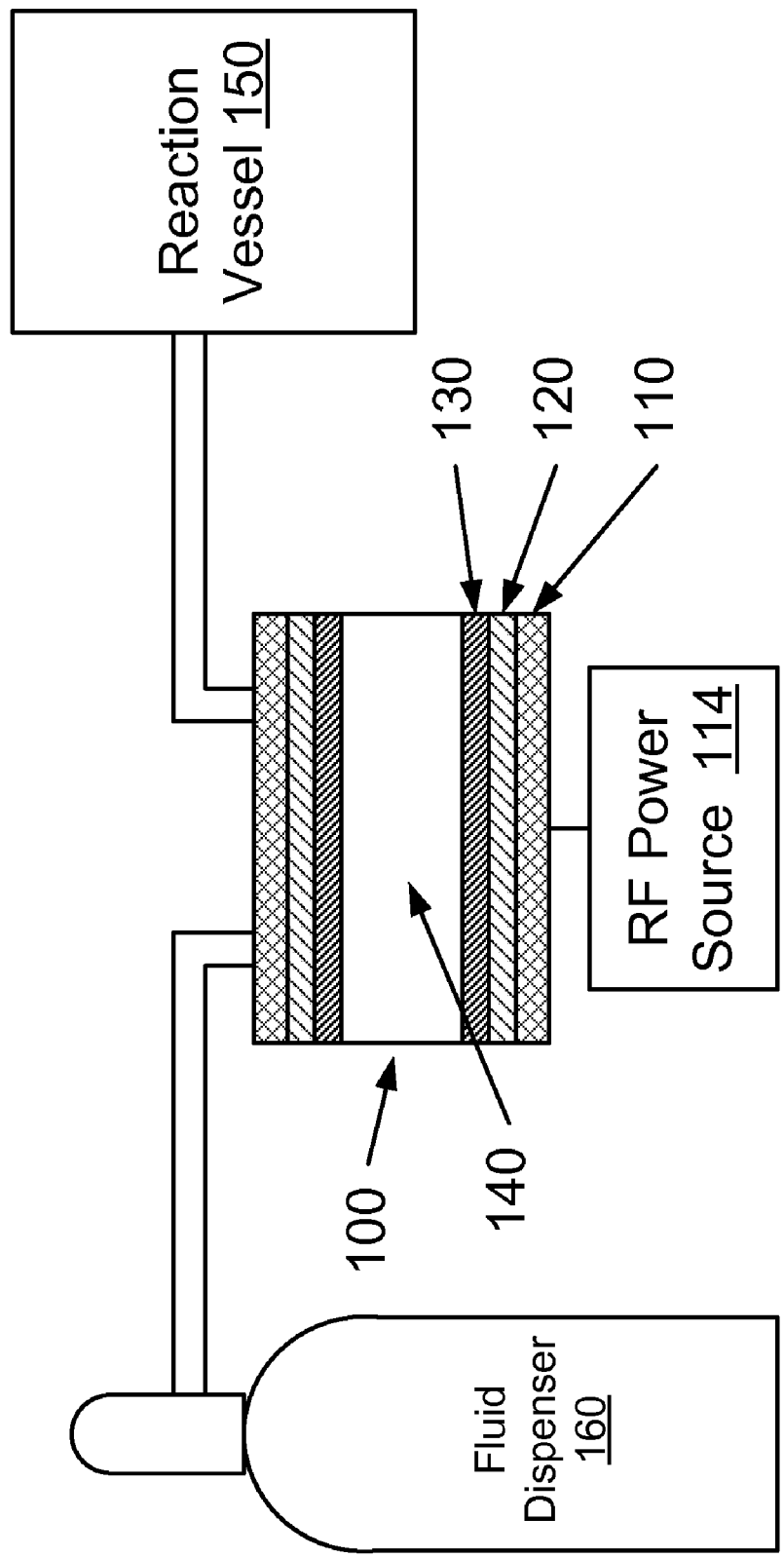
FIG. 1 is a schematic diagram that illustrates a cross-sectional view of a remote plasma chamber configured to generate a chemically-reducing species, according to an embodiment of the invention.

Referring now to the drawings, where like or similar elements are designated with identical reference numerals throughout the several views, and referring in particular to FIG. 1, it is a schematic diagram that illustrates a cross-sectional view of a plasma chamber 100 configured to generate one or more chemically-reducing species, according to an embodiment of the invention. The plasma chamber 100 is a remote and/or inductively coupled plasma chamber and can be referred to as an inductively coupled, remote plasma chamber. The fluid dispenser 160 dispenses a fluid into the plasma chamber 100 and the fluid is ignited into a plasma that creates the chemically-reducing species in an interior region 140 of the remote plasma chamber 100. The chemically-reducing species can be, for example, atomic hydrogen formed by dissociation of a fluid such as ammonia ($NH_3$) or molecular hydrogen ($H_2$).

The plasma chamber 100 can be configured to operate at a variety of temperatures and/or pressures. For example, the plasma chamber 100 is configured to operate at atmospheric pressure or a very low pressure (e.g., vacuum). In some embodiments, the plasma chamber 100 is configured to operate at room temperature.

After the chemically-reducing species has been formed, the plasma chamber 100 is configured to deliver the chemically-reducing species to a reaction vessel 150. In some embodiments, the reaction vessel 150 is a semiconductor processing reaction vessel used, for example, for removal of oxides from the surface of a substrate (e.g., silicon wafer), thin film deposition on a substance (e.g., a silicon wafer), etc.

The plasma chamber 100 is configured to form the plasma (and the chemically-reducing species) using inductive power from a radio frequency (RF) power source 114. The remote plasma chamber 100 includes an RF power antenna 110 (also can be referred to as an RF power induction component) such as an RF power induction coil that is coupled to the RF power source 114. The RF power source 114 uses RF inductive power via the RF power antenna 110 to generate an electromagnetic field in the interior region 140 of the remote plasma chamber 100 that causes a plasma to be formed and sustained in the remote plasma chamber 100 from a fluid. In some embodiments of the invention, the plasma (and chemically-reducing species) is formed when a molecular gas is dissociated within the plasma chamber 100 in response to energy from the RF power source 114. In this embodiment, the RF power antenna 110 is an RF power induction coil, but in some implementations, the RF power antenna 110 is one or more flat plate-like antenna structures.

In this embodiment, the plasma chamber wall 120, and, in particular, an inner surface of the wall 120 is formed of an oxide-based dielectric material such as an oxide ceramic (e.g., alumina or quartz). The plasma chamber wall 120 is formed of the dielectric material so that an electromagnetic field can be properly generated in the interior 140 of the remote plasma chamber 100.

The inner surface of the plasma chamber wall 120 of the remote plasma chamber 100, in this embodiment, is protected by a barrier layer 130 so that the chemically-reducing species, when generated, will be prevented from interacting with the oxide-based dielectric material of the plasma chamber wall 120. The chemically-reducing species is prevented from interacting with the chamber wall 120 because the chemically-reducing species can react with the oxide-based dielectric material to form a conductive substance on the inner surface of the plasma chamber wall 120 that inhibits plasma formation and/or sustenance. The chemically-reducing species reacts with the oxide-based material of the plasma chamber wall 120 to form a modified layer that is, in many embodiments, a conductive substance. In some embodiments, the barrier layer 130 is configured so that the barrier layer 130 protects the plasma chamber 100 from the chemically-reducing species that is produced at any place in the plasma chamber 100.

If a conductive layer forms on the inner surface of the plasma chamber wall 120, in some implementations, the conductive substance degrades the power coupling to the plasma, reducing the energy in the interior 140 of the plasma chamber. This reduces the ability of the plasma chamber 100 to ignite and/or sustain a plasma. In other words, the chemically-reducing species, if it interacts (e.g., reacts) with the inner surface of the plasma chamber wall 120, can reduce the plasma ignition or sustenance capability of the remote plasma chamber 100. In some plasma chambers, the plasma chamber can fail to ignite at least 50% of the time after less than 72 hours of operation without a barrier layer 130.

In several embodiments, the barrier layer 130 is formed of non-oxide material that is inert with respect to the chemically-reducing species. And in many embodiments, the barrier layer 130 is formed of a non-conductive material such as a boron nitride, silicon carbide, silicon nitride, aluminum nitride, or boron carbide. The material that is used to form the plasma chamber wall 320 can be referred to as a barrier-layer material or plasma-reduction-resistant material.

Although the plasma chamber 100 in this embodiment can be a remote plasma chamber, in some embodiments, the plasma chamber is a plasma chamber designed to form a plasma species (e.g., chemically-reducing species) and use the plasma species in an in situ reaction. The plasma chamber 100, in the exemplary embodiment, is a high density, high-output-flux plasma chamber (e.g., volumetric power densities of about 10 W/cm$^3$), but in some embodiments, the plasma chamber 100 is a large, low-flux plasma chamber (e.g., volumetric power densities of about 0.1 W/cm$^3$).

Figure 2:
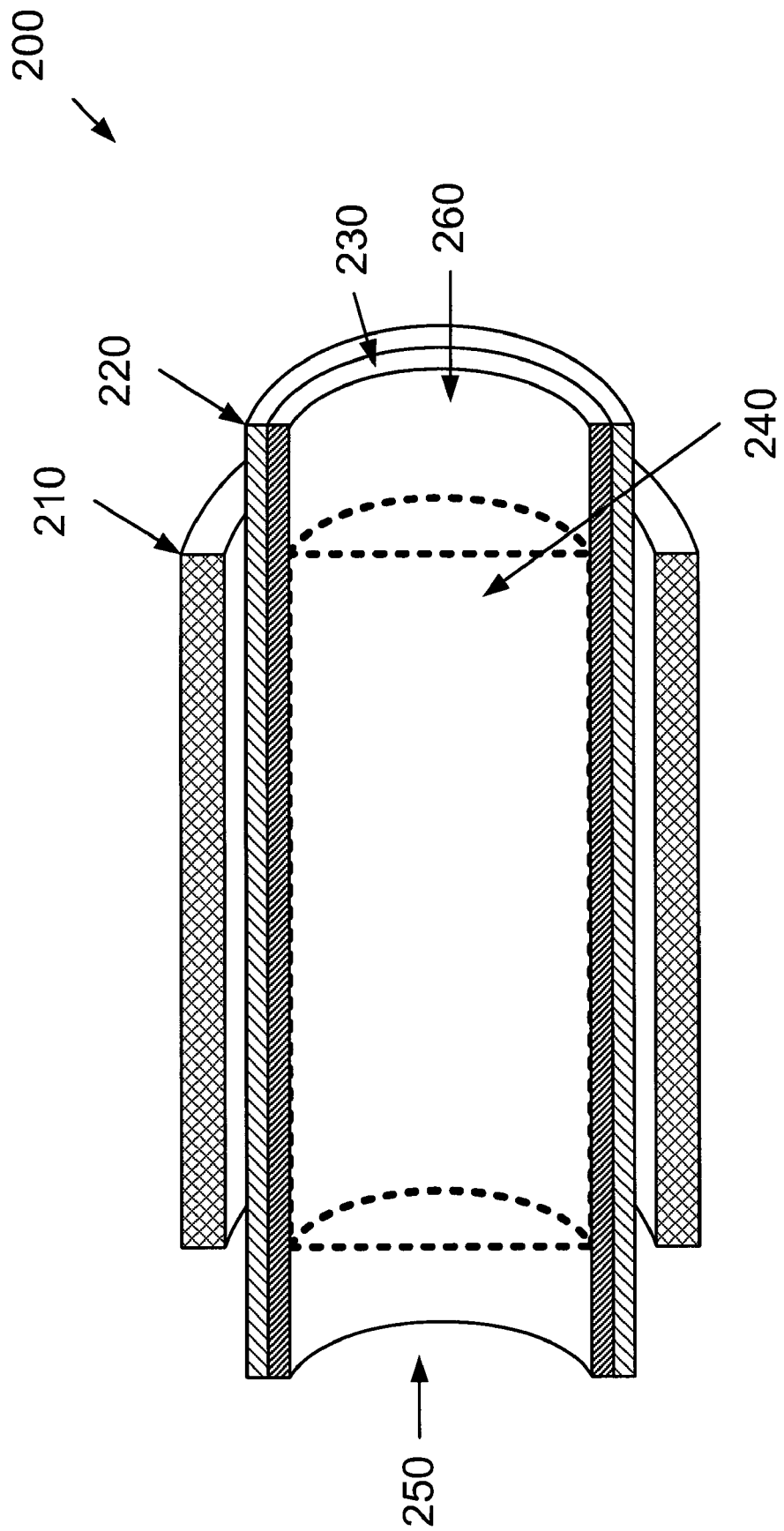
FIG. 2 is a schematic diagram of a cross-sectional view of a plasma chamber with a barrier layer coupled to an inner surface of a plasma chamber wall, according to an embodiment of the invention.

FIG. 2 is a schematic diagram of a cross-sectional view of a plasma chamber 200 with a barrier layer 230 coupled to an inner surface of a plasma chamber wall 220, according to an embodiment of the invention. The plasma chamber 200, in this embodiment, is an inductively coupled plasma chamber (e.g., a remote plasma source plasma chamber) that is configured to ignite a plasma in the plasma formation region 240 to create one or more chemically-reducing species. The plasma formation region corresponds with a volume where an electromagnetic field is generated by an RF power induction component 210. The plasma chamber wall 220 is constructed of an oxide-based material that forms a conductive, plasma-inhibiting material on an inner surface of the plasma chamber wall 220 in response to a reaction with the chemically-reducing species.

The barrier layer 230 is a layer that prevents the chemically-reducing species, when formed within the plasma chamber 200, from interacting with the inner surface of the plasma chamber wall 220. Specifically, the barrier layer 230 is configured to prevent the chemically-reducing species formed in the plasma formation region 240 from interacting with the inner surface of the plasma chamber wall 220. The barrier layer 230, in this embodiment, is coated on the inner surface of the plasma chamber wall 220.

FIG. 2 shows that the barrier layer entirely covers the inner surface of the plasma chamber wall 220. In some embodiments, the barrier layer 230 covers only a portion of the inner surface of the plasma chamber wall 220. In some embodiments, the barrier layer 230 covers at least the inner surface of the plasma chamber wall 220 that corresponds with regions where the chemically-reducing species will be formed (e.g., the plasma formation region 240).

Although FIG. 2 shows that this plasma chamber 200 is cylindrical, the plasma chamber 200, in some embodiments, is a different shape. For example, in some embodiments, the plasma chamber 200 is a shaped like a rectangular box. Also, the fluid that is formed into the plasma can be introduced into the plasma chamber 200 from either opening 250 or 260 of the plasma chamber 200. In some embodiments, the fluid that is formed in the plasma is introduced in an orifice/opening (not shown) that is not located at one of the ends 250 or 260 of the plasma chamber 200.

Figure 3:
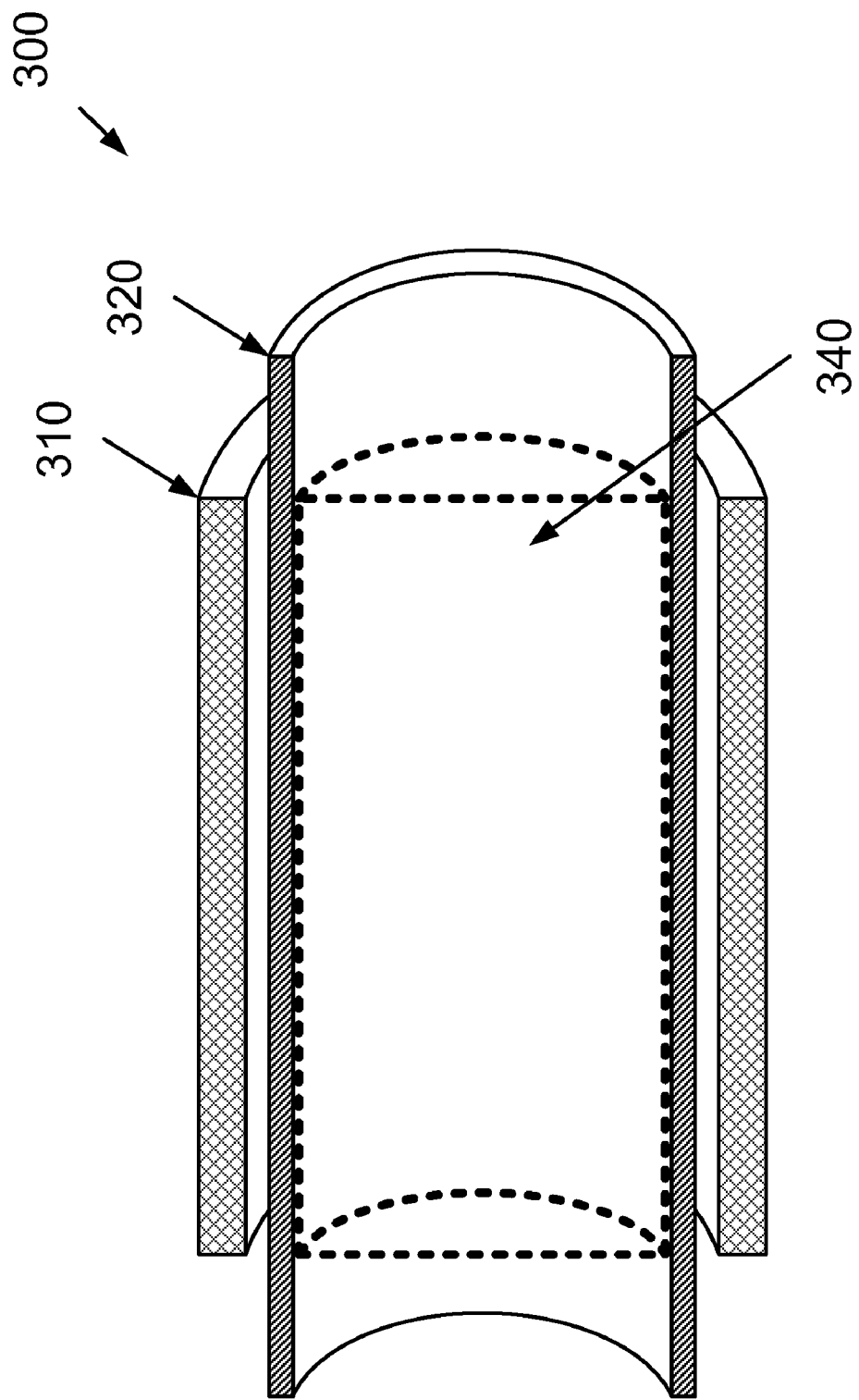
FIG. 3 is a schematic diagram of a cross-sectional view of a plasma chamber that has a plasma chamber wall formed of a material that is substantially inert to a chemically-reducing species, according to an embodiment of the invention.

FIG. 3 is a schematic diagram of a cross-sectional view of a plasma chamber 300 that has a plasma chamber wall 320 formed of a material that is substantially inert to one or more chemically-reducing species, according to an embodiment of the invention. The exemplary plasma chamber 300 is an inductively coupled plasma chamber (e.g., within a remote plasma source) that is configured to ignite and/or sustain a plasma in the plasma formation region 340 to form one or more chemically-reducing species. The plasma formation region corresponds with a volume where an electromagnetic field is generated by an RF power induction component 310.

The plasma chamber wall 320 is constructed of a material that is substantially inert to the chemically-reducing species that is ignited and/or sustained in the plasma formation region 340. In other words, the plasma chamber wall 320 is formed/constructed of a material that does not form a plasma-inhibiting substance (e.g., conductive material) when the plasma chamber wall 320 interacts with the chemically-reducing species formed in the plasma formation region 340. The plasma chamber wall 320 is, for example, formed of a non-conductive material that is substantially resistant to being reduced by the reducing species to form a conductive material. In one embodiment for example, the chamber wall includes boron nitride, but in other embodiments include one or more other plasma-reduction-resistant materials.

In some embodiments, only a portion or portions of the plasma chamber wall 320 are formed of the plasma-reduction-resistant material. For example, only the portions of the plasma chamber wall 320 near the plasma formation region 340 are constructed of the plasma-reduction-resistant material in some embodiments.

Figure 4:
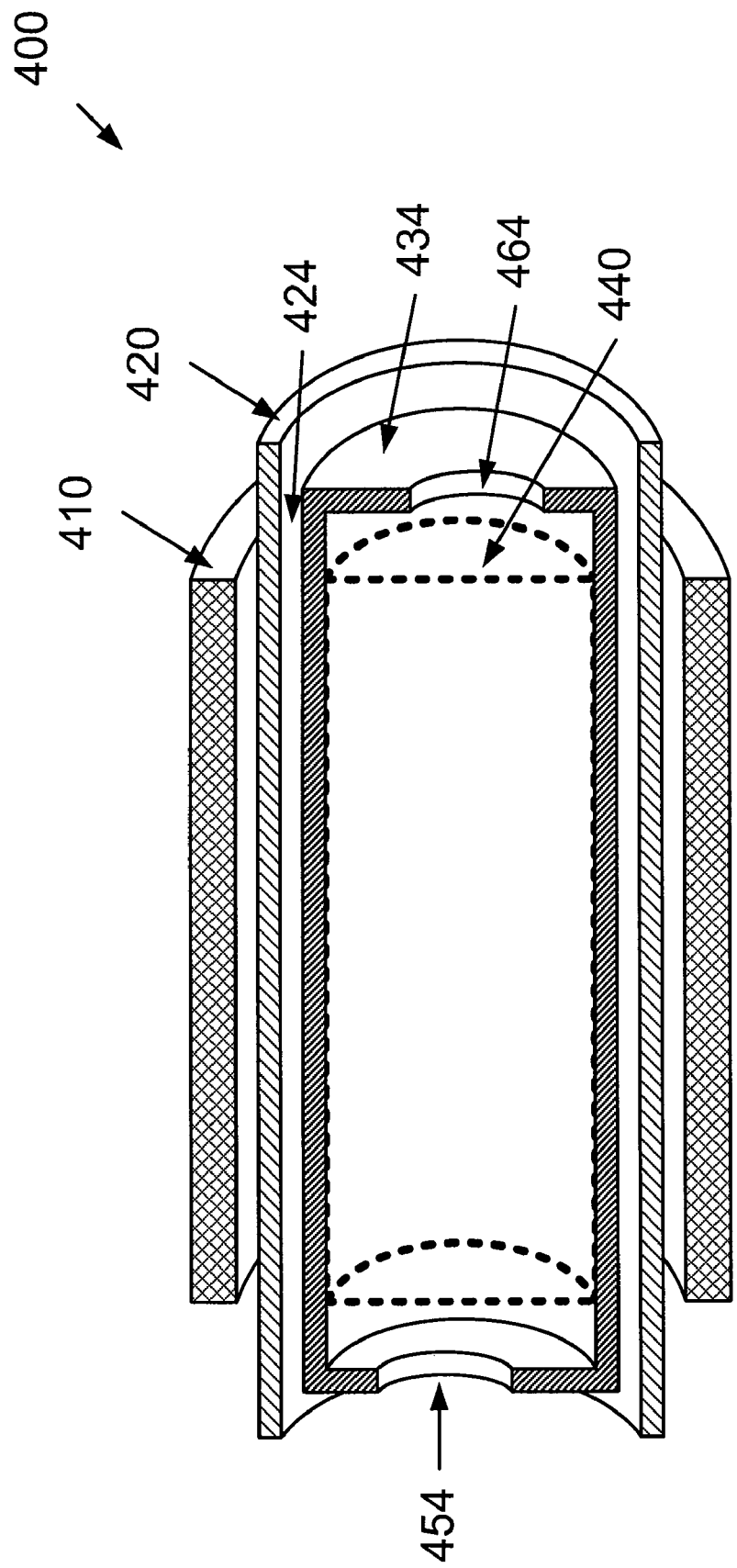
FIG. 4 is a schematic diagram of a cross-sectional view of a plasma chamber with a barrier component disposed within the plasma chamber, according to an embodiment of the invention.

FIG. 4 is a schematic diagram of a cross-sectional view of a plasma chamber 400 with a barrier component 434 disposed within the plasma chamber 400, according to an embodiment of the invention. The plasma chamber 400, in this embodiment, is an inductively coupled plasma chamber (e.g., a remote plasma source) that is configured to ignite and/or sustain a plasma in a plasma formation region 440 to form one or more chemically-reducing species. The plasma formation region corresponds with a volume where an electromagnetic field is generated by an RF power induction component 410. The plasma chamber wall 420 is constructed of an oxide-based material that forms a conductive, plasma-inhibiting material on an inner surface of the plasma chamber wall 420 in response to a reaction with the chemically-reducing species.

The barrier component 434 is a component that prevents the chemically-reducing species from interacting with the inner surface of the plasma chamber wall 420. The barrier component 434, in this embodiment, is entirely formed of a barrier-layer material (e.g., plasma-reduction-resistant material). The barrier component 434 is disposed within the plasma chamber 400 such that an insulating layer 424 is disposed between the plasma chamber wall 420 and a wall of the barrier component 434.

The insulating layer 424 allows for thermal expansion of the barrier component 434, which can be different than that of the plasma chamber wall 420. In some embodiments, the insulating layer 424 is also a thermal insulating layer. The barrier component 434 is configured as a removable component so that it is conveniently cleaned and/or replaced, if necessary.

As shown in FIG. 4, the plasma formation region 440 is entirely disposed within the barrier component 434. An inner surface of the barrier component 434 defines the plasma formation region 440. In this embodiment, a fluid that is ignited into a plasma to form the chemically-reducing species is injected (e.g., introduced) into the barrier component 434 via opening 454. The plasma only forms within the plasma formation region 440 because the fluid is injected directly into the barrier component 434. The chemically-reducing species, after being formed in the plasma formation region 440, is delivered to, for example, a reaction vessel (not shown) via opening 464. The openings 454 and 464 in the barrier component 434, in some embodiments, are in different locations within the barrier component 434.

In some variations, only a portion of the barrier component 434, such as the inner surface of the barrier component 434 is formed of a barrier-layer material. In some implementations, the size of the barrier component 434 is decreased so that the plasma formation region 440 is a different size (e.g., smaller). Although in this embodiment an insulating layer 424 is disposed between the barrier component 434 and the inner surface of the plasma chamber wall 420, in some embodiments of the invention, the barrier component 434 is coupled to the inner surface of the plasma chamber wall 420.

Figure 5:
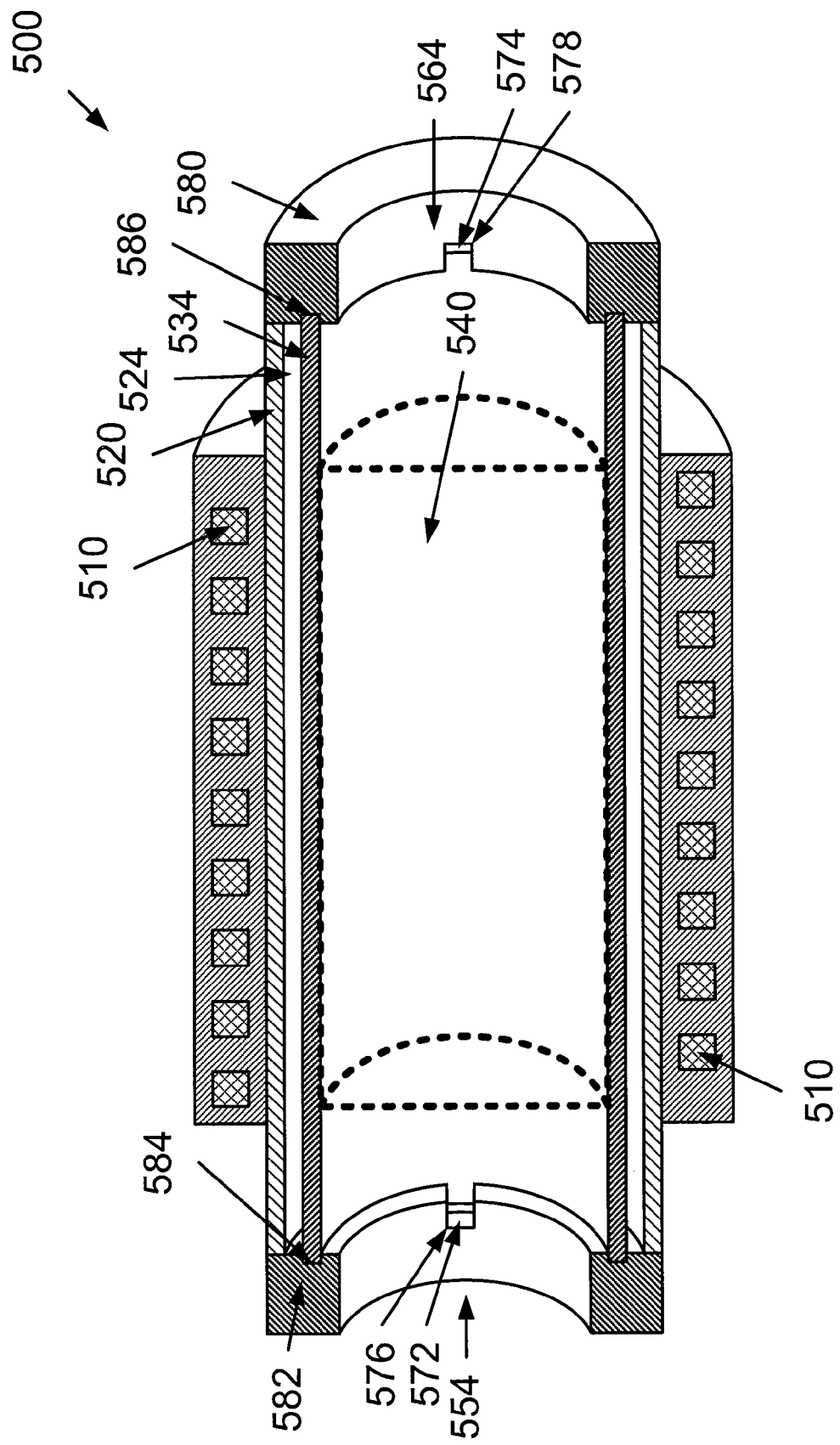
FIG. 5 is a schematic diagram of a cross-sectional view of a plasma chamber with a barrier component disposed within the plasma chamber and supported with flanges, according to an embodiment of the invention.

FIG. 5 is a schematic diagram of a cross-sectional view of a plasma chamber 500 with a barrier component 534 disposed within the plasma chamber 500 and supported with flanges 582 and 580, according to an embodiment of the invention. The plasma chamber 500 is an inductively coupled plasma chamber (e.g., inductively coupled within a remote plasma source) that is configured to ignite and/or sustain a plasma in a plasma formation region 540 to form one or more chemically-reducing species. The plasma formation region corresponds with a volume where an electromagnetic field is generated by an RF power induction component 510. The power induction component 510 is an RF power induction coil that includes resonant and non-resonant sections. The plasma chamber wall 520 is constructed of an oxide-based material that forms a conductive, plasma-inhibiting material on an inner surface of the plasma chamber wall 520 in response to a reaction with the chemically-reducing species.

The flanges 580 and 582 are configured so that the barrier component 534 is supported by the flanges 580 and 582 in the plasma chamber 500 when the barrier component 534 is inserted into the slots 584 and 586 and the flanges 580 and 582 are coupled to the plasma chamber 500. The flanges 580 and 582 can be referred to as barrier-support components. The flanges 580 and 582 are configured so that the flanges 580 and 582 are removably coupled to the plasma chamber 500 (e.g., using bolts or latches) and the barrier component 534 is removably coupled to the flanges 580 and 582. The barrier component 534 is configured as a removable component so that it can be conveniently cleaned and/or replaced, if necessary.

The barrier component 534 is supported by the flanges 580 and 582 in the plasma chamber 500 such that an insulating layer 524 is disposed between the plasma chamber wall 520 and a wall of the barrier component 534. The insulating layer 524 allows for thermal expansion of the barrier component 534, which can be different than that of the plasma chamber wall 520. In some embodiments, the insulating layer 524 is also a thermal insulating layer.

The barrier component, in some implementations, is configured such that there is fluid communication between the interior of the barrier component 534 and the exterior of the barrier component 534 via, for example, the optionally included openings 572 and 574, and/or one or more separate openings (not shown). In this embodiment, the openings 572 and 574 are formed by notches 576 and 578 included in the flanges 582 and 580, respectively.

The fluid communication between the interior and the exterior regions of the barrier component 534 allows the environments (e.g., pressure) in the interior and the exterior regions to be substantially similar (e.g., similar pressure and temperature). For example, when a vacuum is formed in the plasma formation region 540, a vacuum will also be formed in regions within the plasma chamber that are exterior to barrier component 534 (e.g., in the insulating layer 425) because of the fluid communication.

The openings 572 and 574 are designed such that the chemically reducing species is not able to interact with the plasma chamber wall 520 even though there is fluid communication between the interior of the barrier component 534 and the insulating layer 524. FIG. 5 shows that the openings 572 and 572 are sufficiently small and disposed at a location separate from the plasma formation region 540 where the chemically-reducing species is formed. In some embodiments, multiple openings can be included in the flanges 580 and 582, barrier component 534, and/or at junctions between the flanges 580 and 582 and the barrier component 534.

As shown in FIG. 5, the plasma formation region 540 is entirely disposed within the barrier component 534 so that the chemically-reducing species that is produced at any place in the plasma chamber 500 is prevented from interacting with the plasma chamber wall 520. In other words, an inner surface of the barrier component 534 defines the plasma formation region 540. In this embodiment, a fluid that is ignited to form the chemically-reducing species is injected (e.g., introduced) into the barrier component 534 via opening 554. The plasma only forms within the plasma formation region 540 because the fluid is injected directly into the barrier component 534. The chemically-reducing species, after being formed in the plasma formation region 540, is delivered to, for example, a reaction vessel (not shown) via opening 564. The openings 554 and 564 in the barrier component 534 can be in different locations within the barrier component 534, in some embodiments.

Figure 6:
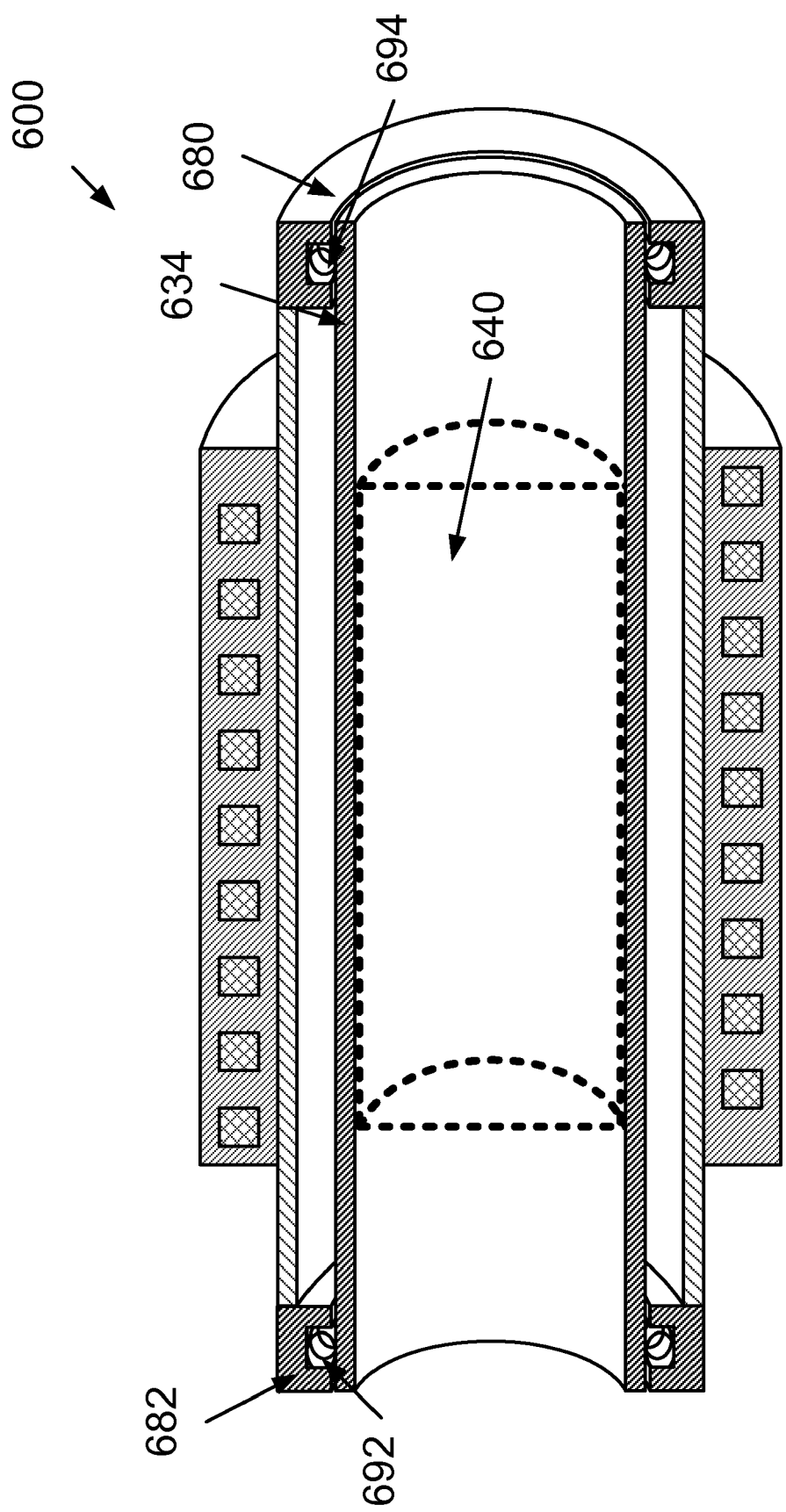
FIG. 6 is a schematic diagram of a cross-sectional view of a barrier component disposed within a plasma chamber, according to an embodiment of the invention.
Figure 7:
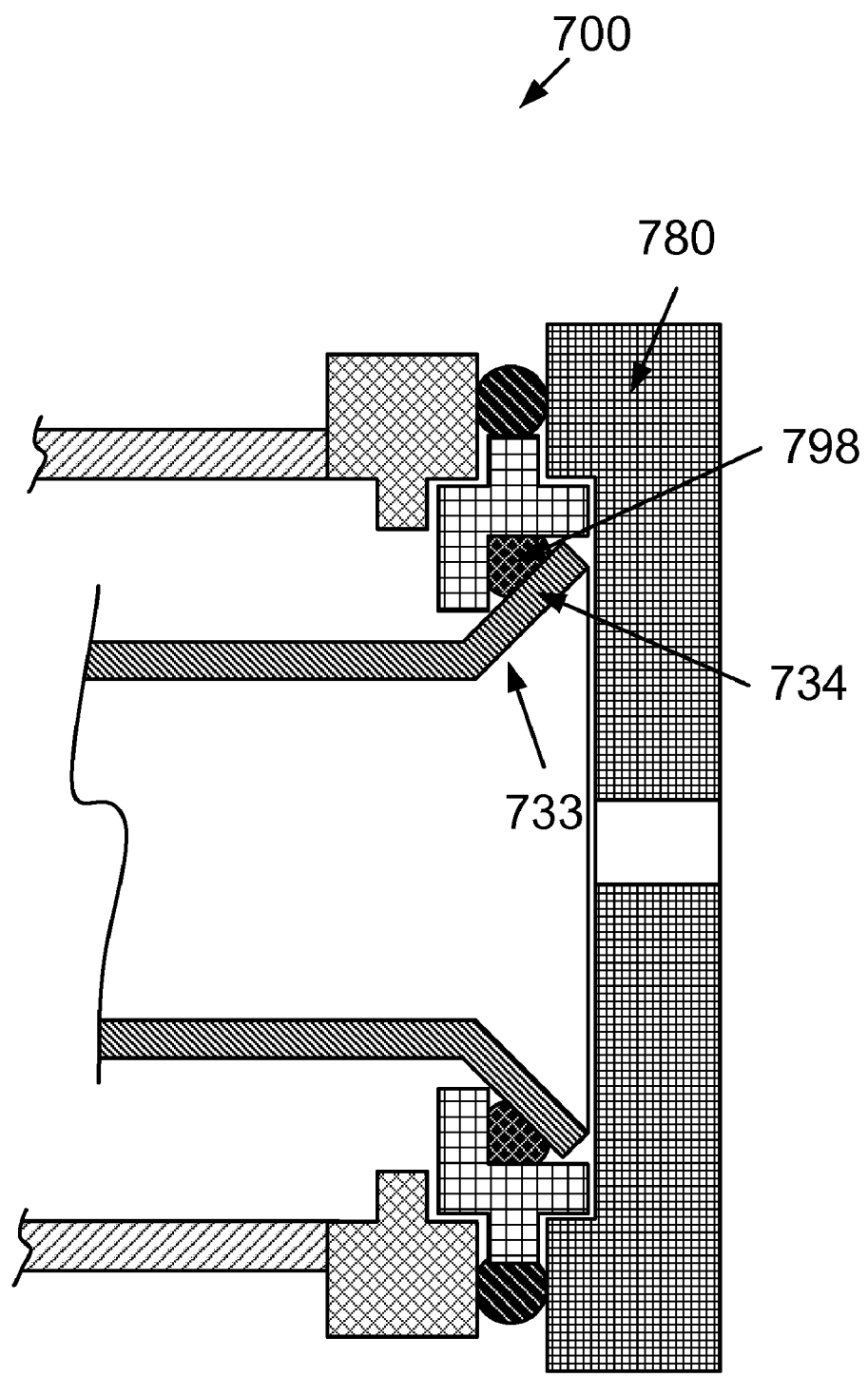
FIG. 7 is a schematic diagram of a portion of a cross-sectional view of a barrier component disposed within a plasma chamber, according to an embodiment of the invention.

Although the barrier component 534 shown in FIG. 5 is supported using flanges, in some embodiments, the barrier component 534 is supported in a variety of ways that should be appreciated by a person of skill in the art having the benefit of this disclosure. FIGS. 6 and 7 show possible apparatus with which a barrier component is coupled (e.g., removably coupled) to a plasma chamber.

FIG. 6 is a schematic diagram of a cross-sectional view of a barrier component 634 disposed within a plasma chamber 600 using a barrier-support component, according to an embodiment of the invention. Similar to the plasma chamber shown in FIG. 5, the plasma chamber 600 is an inductively coupled plasma chamber (e.g., inductively coupled within a remote plasma source) that is configured to ignite a plasma to form one or more chemically-reducing species in a plasma formation region 640 within a barrier component 634. However, the barrier component 634 in this embodiment is supported in the plasma chamber 600 using spring coil mechanisms 692 and 694 disposed in grooves within the flanges 682 and 680, respectively. The spring coil mechanisms 692 and 694 can be referred to as barrier support components. In some embodiments, the ends of the barrier component 634 can be tapered to facilitate insertion into the plasma chamber 600.

FIG. 7 is a schematic diagram of a portion of a cross-sectional view of a barrier component 734 disposed within a plasma chamber 700, according to an embodiment of the invention. The barrier component 734, in this embodiment, includes a barrier-support component that is a barrier component flange 733 that is pressed against a seal 798 by a flange 780. The barrier component 734 is positioned within the plasma chamber 700 based on the shape of the barrier component flange 733. In this implementation, the barrier component 734 is removably coupled within the plasma chamber 700 because the flange 780 is removably coupled to the plasma chamber 700. When the flange 780 is removed, the barrier component 734 can be removed from its position in the plasma chamber 700.

Figure 8:
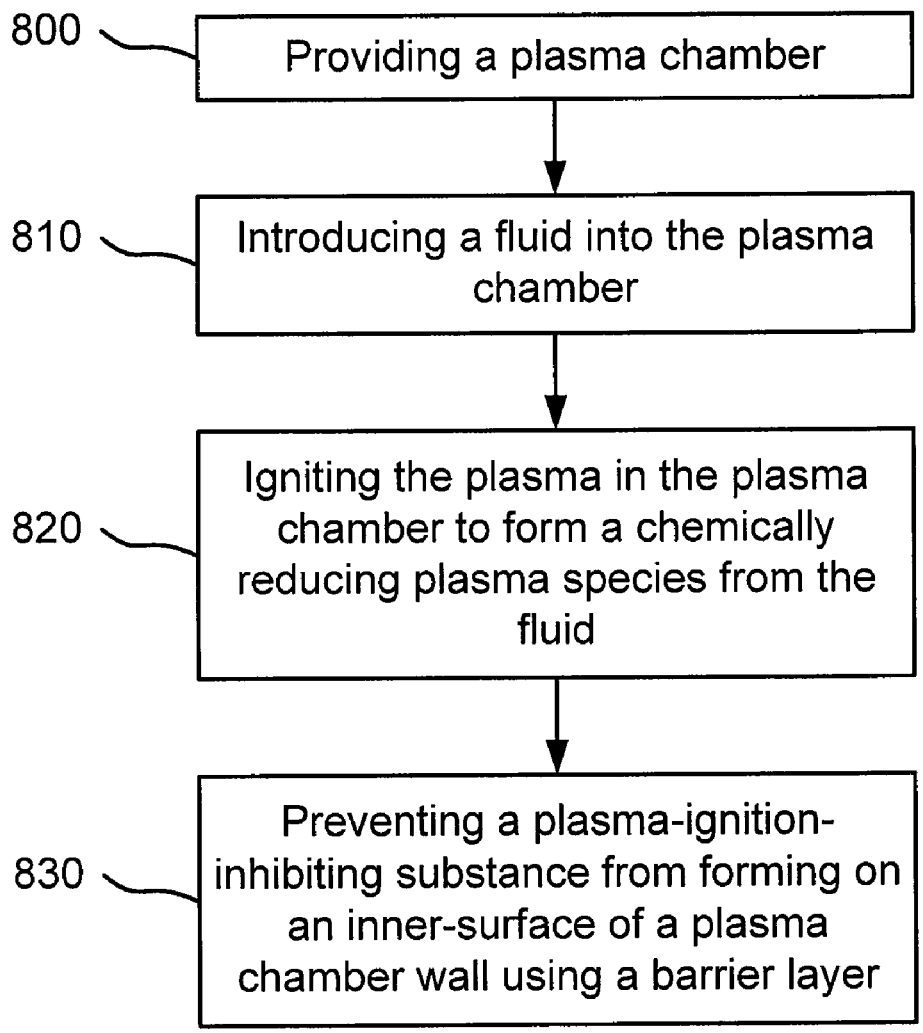
FIG. 8 illustrates a method for preventing a plasma-ignition-inhibiting substance from forming on an inner surface of a plasma chamber wall, according to an embodiment of the invention.

FIG. 8 illustrates a method for preventing a plasma-inhibiting substance from forming on an inner surface of a plasma chamber wall, according to an embodiment of the invention. FIG. 8 shows that first a plasma chamber is provided (block 800). The plasma chamber can be an inductively coupled and/or remote plasma chamber.

A fluid is introduced into the plasma chamber (block 810) and a plasma is ignited within the plasma chamber to form one or more chemically-reducing species from the fluid (block 820). The fluid is introduced into one or more orifices in the plasma chamber that allow the fluid to be introduced into a plasma formation region. The plasma is formed in the plasma formation region within the plasma chamber. In some embodiments, the plasma formation region is a cylindrical in shape while in other implementations, the plasma formation region is a different shape (e.g., square). In some embodiments, more than one chemically-reducing species is formed within the fluid.

The plasma chamber is designed such that a plasma-inhibiting substance is prevented from forming on an inner surface of a plasma chamber wall using a barrier layer (block 830). In some embodiments, the chemically reducing species is prevented from interacting with the inner surface of the plasma chamber wall by a barrier layer that is substantially inert with respect to the chemically-reducing species. In some embodiments, the barrier layer is coated on the inner surface of the plasma chamber. In some implementations of the invention, the plasma chamber or substantial portions of the plasma chamber are constructed of a material that prevents formation of a plasma-inhibiting substance.

The barrier layer, in some embodiments, is a barrier component (e.g., sleeve) that is inserted into the plasma chamber. Some variations of the barrier component are removably coupled within the plasma chamber. If the barrier layer is included in or is a barrier component, in some embodiments, the plasma formation region is entirely disposed within the barrier component.

Figure 9:
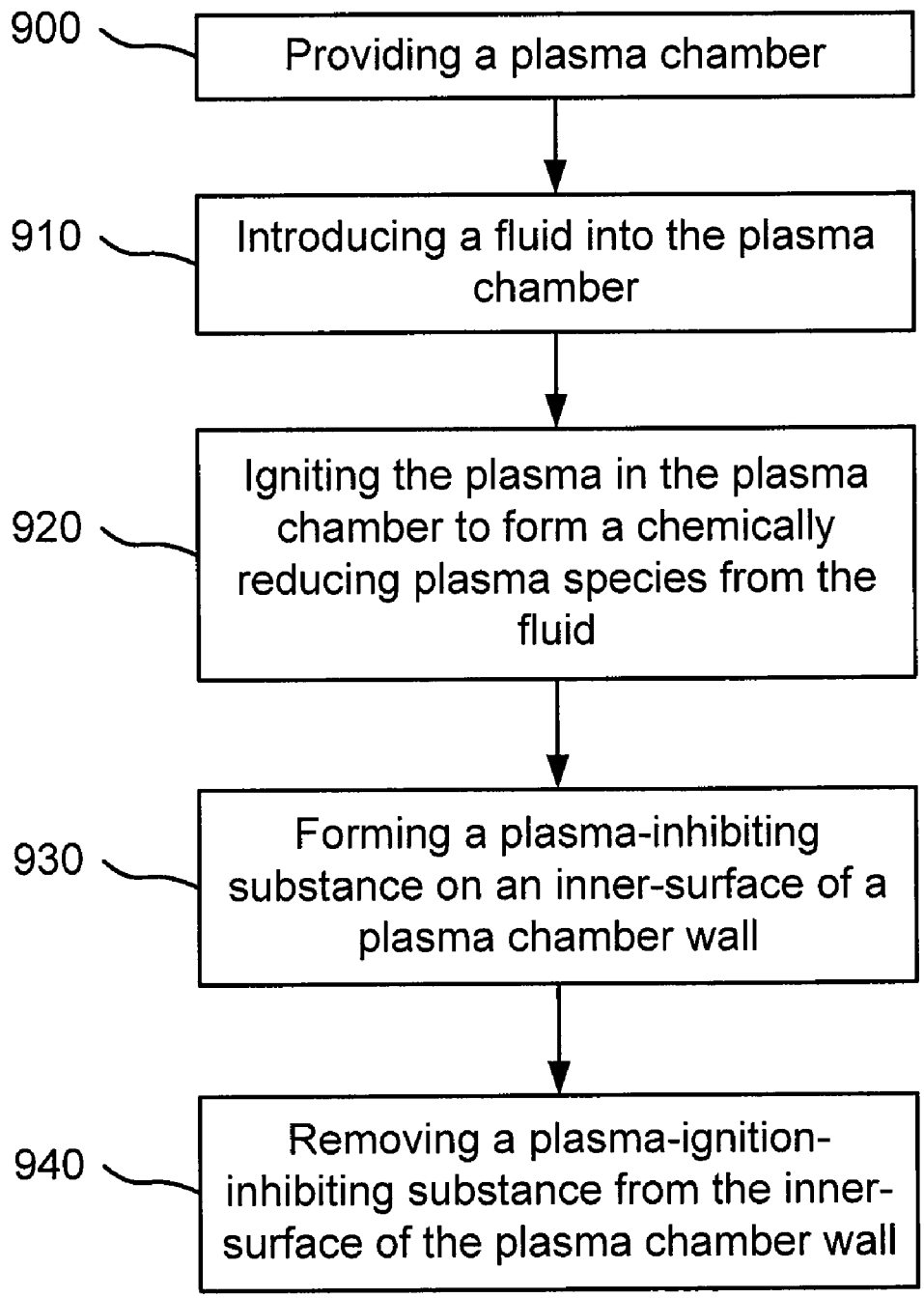
FIG. 9 illustrates a method for removing a plasma-inhibiting substance after it has formed on an inner surface of a plasma chamber wall, according to an embodiment of the invention.

FIG. 9 illustrates a method for removing a plasma-inhibiting substance after it has formed on an inner surface of a plasma chamber wall, according to an embodiment of the invention. The flowchart in FIG. 9 shows that a plasma chamber is first provided (block 900). The plasma chamber can be an inductively coupled and/or remote plasma chamber.

A fluid is introduced into the plasma chamber (block 910) and a plasma is ignited within the plasma chamber to form one or more chemically-reducing species from the fluid (block 920). Because an inner surface of the plasma chamber where ignition occurs (e.g., within a plasma formation region) is formed of an oxide-based substance, a plasma-inhibiting substance forms on the inner surface of the plasma chamber wall (block 930). In other words, the inner surface of the plasma chamber wall is converted into a plasma-inhibiting substance.

After the plasma-inhibiting substance has formed, the plasma-inhibiting substance is removed from the inner surface of the plasma chamber wall (block 940). In some embodiments, the plasma-inhibiting substance is etched from the inner surface using a gas that will preferably etch the plasma-inhibiting substance from the wall with high selectivity. The by-products produced during the etching process are pumped out of the plasma chamber as the etching progresses. For example, a fluorinated gas (e.g., $NF_3$) is used in some embodiments to clean a quartz chamber after a plasma-inhibiting substance has formed on the inner surface of the quartz chamber. In some variations, a chlorine-bearing gas is also be used to etch the inner surface of a plasma chamber wall after a plasma-inhibiting substance has been formed. In some embodiments, a component (e.g., removable quartz sleeve) from a plasma chamber is cleaned using the method described in FIG. 9 after a plasma-inhibiting substance has formed on the surface of the component.

In conclusion, the present invention provides, among other things, a system and method for removing or preventing formation of a plasma-inhibiting substance within a plasma chamber. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A plasma chamber apparatus having a plasma formation region where a fluid containing molecules, that can be disassociated into chemically-reducing species, is ignited into a plasma by an electro-magnetic field to create the chemically-reducing species, said plasma chamber apparatus comprising:
    a cylindrical dielectric plasma chamber wall of a non-conductive material substantially reactive to the chemically-reducing species;
    a cylindrical dielectric barrier wall co-axially disposed within the dielectric plasma chamber wall and being positioned as a barrier between the dielectric plasma chamber wall and the chemically-reducing species created in the plasma formation region, the dielectric barrier wall being non-conductive and formed of a substance that is substantially inert to the chemically-reducing species;
    the plasma formation region being entirely located within an axial interior region of the cylindrical dielectric barrier wall;
    an electro-magnetic field source exterior to the dielectric plasma chamber wall whereby the electro-magnetic field igniting the fluid in the plasma formation region passes through the dielectric chamber wall and the dielectric barrier wall;
    an injection opening at one axial end of the dielectric plasma chamber wall and the dielectric barrier wall, the injection opening is in fluid communication with the plasma formation region, the fluid being introduced into the axial interior region of the cylindrical barrier wall via the injection opening;
    a delivery opening at other axial end of the dielectric plasma chamber wall and the dielectric barrier wall, the delivery opening is in fluid communication with the plasma formation region, and the chemically-reducing species being delivered from the axial interior region of the cylindrical barrier wall via the delivery opening;
    a gap between the cylindrical, dielectric plasma chamber wall and the cylindrical dielectric barrier wall, the gap is co-axially disposed between the cylindrical dielectric plasma chamber wall and the cylindrical dielectric barrier wall; and
    a pressure-equalizing opening located around at least one axial end of the cylindrical dielectric barrier wall between the gap and axial interior region of the cylindrical dielectric barrier wall; the pressure-equalizing opening enables a pressure within the gap to be substantially the same as a pressure within the plasma formation region;

the apparatus further including a flange at each axial end of cylindrical dielectric barrier wall with a circular slot to receive and support the cylindrical dielectric barrier wall, one flange including the injection opening and other flange including the delivery opening, the flanges are removably coupled to axial ends of the cylindrical dielectric plasma chamber wall, and the cylindrical dielectric barrier wall is removably coupled to the flanges; and wherein the pressure-equalizing opening is formed by a notch formed in the circular slot of at least one of the flanges that is coupled to the cylindrical dielectric barrier wall.

2. The apparatus of claim 1, wherein the electro-magnetic field source is an RF power induction component disposed exterior to the outer surface of the cylindrical plasma chamber wall, the RF power induction component being configured to receive RF power from an RF power source, and the plasma formation region corresponds to a volume where an electro-magnetic field is generated by the RF power induction component.

3. The apparatus of claim 1, wherein the cylindrical dielectric plasma chamber wall is formed of an oxide material that is susceptible to reduction in a reducing environment and the cylindrical dielectric barrier wall is formed of a non-oxide material resistant to reduction in a reducing environment.

4. A plasma source having a plasma chamber with a plasma formation region where a chemically-reducing species is created by a plasma ignited from a fluid by an electro-magnetic field, said plasma source comprising:

a cylindrical dielectric plasma chamber wall of a non-conducting material reactive to the chemically-reducing species;

an electro-magnetic field source for the plasma formation region, the field source located outside the plasma chamber wall;

a cylindrical dielectric barrier sleeve coaxially disposed within the cylindrical plasma chamber wall, the cylindrical barrier sleeve is substantially inert to the chemically-reducing species and is positioned as a barrier between the dielectric plasma chamber wall and the chemically-reducing species created in the plasma formation region;

gap disposed between the plasma chamber wall and the cylindrical barrier sleeve;

a first flange coupled to the plasma chamber wall and the barrier sleeve closing one end of the plasma chamber, a second flange coupled to the plasma chamber wall and the barrier sleeve closing other end of the plasma chamber, the plasma chamber wall and the barrier sleeve being removably coupled to both the first flange and the second flange;

the first flange having an injection opening for the introduction of the fluid into the interior region defined by the barrier sleeve;

the second flange having a delivery opening for delivering from the interior region of the barrier sleeve the chemically-reducing species disassociated from the fluid by the plasma;

at least one of the first flange or the second flange having a pressure-equalizing opening allowing fluid communication between the gap and the interior region of the cylindrical barrier sleeve so as to enable a vacuum to be formed in the insulating layer when a vacuum is formed in the interior region of the cylindrical barrier sleeve;

wherein each end of the cylindrical barrier sleeve couples with a circular slot in each flange; and wherein the slot in the flange includes a notch, which forms the pressure-equalizing opening between the interior region of the cylindrical barrier sleeve and the gap.

5. The plasma source of claim 4 wherein a spring coil is disposed in the circular slot of each flange.

6. The plasma source of claim 4 wherein the reactive material making up the plasma chamber wall is alumina or quartz.

7. The plasma source of claim 6 wherein the inert material making up the barrier sleeve is boron nitride, silicon nitride, aluminum nitride, silicon carbide or boron carbide.

* * * * *